United States Patent
Platz

(10) Patent No.: US 6,323,429 B1
(45) Date of Patent: Nov. 27, 2001

(54) ELECTRICAL DEVICE, ELECTRICAL APPLIANCE OF LIGHTING DEVICE

(76) Inventor: Karl-Otto Platz, Siefenerstrasse 29, 51746 Wiehl (DE)

( * ) Notice: Subject to any disclaimer, the term of this patent is extended or adjusted under 35 U.S.C. 154(b) by 0 days.

(21) Appl. No.: 09/462,158
(22) PCT Filed: Jun. 25, 1998
(86) PCT No.: PCT/EP98/03894
   § 371 Date: Jan. 5, 2000
   § 102(e) Date: Jan. 5, 2000
(87) PCT Pub. No.: WO99/03111
   PCT Pub. Date: Jan. 21, 1999

(30) Foreign Application Priority Data

Jul. 8, 1997 (DE) .......................................... 297 11 973 U

(51) Int. Cl.$^7$ .................................................. H01B 7/04
(52) U.S. Cl. ............................................. 174/117 FF
(58) Field of Search ................... 174/117 F, 117 FF, 174/257

(56) References Cited

U.S. PATENT DOCUMENTS

| | | | |
|---|---|---|---|
| 3,576,941 | * 5/1971 | Colglazier | 174/117 FF |
| 3,586,757 | * 6/1971 | Haldeman, Jr. | 174/117 FF |
| 3,805,213 | * 4/1974 | Austin | 174/117 F X |
| 5,155,301 | * 10/1992 | Mase | 174/117 FF X |
| 5,529,829 | * 6/1996 | Koskenmaki et al. | 174/117 F X |
| 5,681,666 | * 10/1997 | Treger et al. | 429/90 |

FOREIGN PATENT DOCUMENTS

| | | | |
|---|---|---|---|
| 3446662 | * | 6/1986 | (DE) . |
| 1580868 | * | 9/1969 | (FR) . |
| 5178644 | * | 7/1993 | (JP) . |

* cited by examiner

Primary Examiner—Chau N. Nguyen
(74) Attorney, Agent, or Firm—Diller, Ramik & Wight

(57) ABSTRACT

An electric device as defined by a current conducting member (1, 2) defined by a non-conductive glass carrier material (1) and at least one transparent electrically conductive layer (2) in the form of a metal oxide sprayed upon a hot surface of the non-conductive glass carrier material (1). The transparent electrically conductive layer (2) has a cross-sectional area $A_{sch}$ and a specific resistance $\delta_{sch}$ whose ratio $\delta_{sch}/A_{sch}$ equals substantially 0.4 $_{ohm/mm}$.

23 Claims, 2 Drawing Sheets

ELECTRICAL DEVICE, ELECTRICAL APPLIANCE OF LIGHTING DEVICE

BACKGROUND OF THE INVENTION

The invention refers to an electric device, an electric apparatus or a lighting device.

Such devices are well known. The conductor arrangement consists of metallic substances, for example, which serve to conduct the electric power to the corresponding consumers. In most cases, these are insulated or uninsulated cables, for example consisting of copper or other conductive materials.

Particularly in lighting technology and especially in the lighting of interior rooms, a supply cable to a consumer has various disadvantages. For instance, it might have an unsightly and unfavorable appearance and might adversely affect the overall impression of the lighting means and the interior room.

There are various possibilities to overcome this problem. In the case of table or standard lamps, the supply cable is usually covered by an envelope of metal or plastics. In the case of interior room lighting, the cables are laid under plaster to keep them from view. Furthermore, it has become standard practice to use the supply cables themselves as decorative objects, for example in the case of halogen rail or rope systems.

However, all these solutions do not provide a supply cable allowing an "invisible power supply" to the consumer, such as a lamp, for example.

SUMMARY OF THE INVENTION

The invention is based on the object to improve an electric device, an electric apparatus or a lighting device in such a manner that a simple and cost-effective, invisible power supply to a consumer is possible.

Due to the conductor arrangement consisting of one or multiple non-conductive carrier materials comprising at least one transparent, conductive and power transferring layer, a power supply to one or multiple consumers is possible in an invisible and simple manner.

When glass is used in this manner as a carrier material, it is possible that a power consumer, e.g. a lamp, can be arranged on a free end of a completely transparent glass arrangement and be operated without a further supply cable. In this context, multiple conductive layers can be applied on one or multiple carrier materials to be electrically coupled. This way, it is possible to supply power to powerful electric devices or especially simply designed electric devices having small dimensions according to requirements. What is more, in such electric devices, different carrier materials can be provided, such as wood and glass, so as to adapt the electric device as well as possible to specific ambient circumstances.

In this context, it has to be remarked that it is already known from automotive engineering to apply transparent, conductive layers on glass to provide a heatable rear and/or frontal windscreen. In this case, however, the electric power supply takes place by means of a conventional supply cable, and the glass with the applied transparent conductive layer is itself the consumer in the circuit and has to comprise a resistance as high as possible so that the power usually comprising a current of more than 10 A can be converted into the heat necessary to heat the windscreen.

However, the conductor arrangement of the device according to the invention serves to supply power to a consumer, and the loss of power (i.e. heat) should be as low as possible.

In this context, the transparent conductive layer should comprise a layer cross-sectional area of $A_{sch}$ and a specific resistance of $\delta_{sch}$, allowing as high a power transfer as possible. A ratio of $\delta_{sch}/A_{sch}$ <0.4 ohms/mm, preferably <0.3 ohms/mm has been found to be advantageous.

Glass has proven to be an especially convenient carrier material regarding the operation, but also regarding the application of the transparent conductive layer.

The transparent conductive layer can also comprise a metal layer such as copper, silver or gold, or another metal oxide layer, such as ITO (indium tin oxide).

To allow a high power transfer, it is preferable that a number of transparent conductive layers, each separated by a transparent insulation layer, are arranged on the non-conductive carrier material. The layers, applied alternately, are more transparent than a thick transparent conductive layer. Such an arrangement can be used like a so-called multilayer circuit board, with power being supplied separately to multiple consumers.

Another possibility to increase performance or to supply power to consumers separately is to arrange a number of non-conductive carrier materials and transparent conductive layers above one another. In this manner, the conductive layers are arranged to be shock-proof in a kind of composite arrangement, whereby the use of glass as a carrier medium provides a good temperature for the conductor arrangement, on the one hand, and the construction of the conductor arrangement provides a high stability, on the other hand. Due to the carrier materials being shiftable relative to one another, the area of application of the conductor arrangement can be adapted to the requirements of the user in a simple manner. If the transparent conductive layers are additionally directed towards one another in the arrangement on the corresponding carrier materials, the power can be controlled in a fairly simple manner by shifting the carrier materials relative to one another.

As the ratio of specific resistance to cross-sectional area of the conductive layers is relatively large in comparison to conventional conductors such as copper cables, the overall resistance of the conductor arrangement $$\left(R = \frac{\delta \times L}{A}\right)$$

also depends to a high degree on the length of the conductive layers. This dependence can be used advantageously in an electric device when the consumer is arranged shiftably on the conductor arrangement. If the conductor arrangement is designed accordingly, power can be controlled by slidingly shifting the consumer.

There now follows a more detailed description of an embodiment of the invention with reference to the accompanying drawings.

DESCRIPTION OF THE PREFERRED EMBODIMENTS

Figure 1:
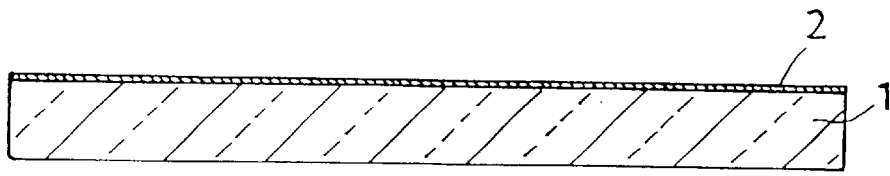
FIG. 1 shows a lateral view of a first embodiment of a conductor arrangement of the device according to the invention.

FIG. 1 shows a lateral view of a conductor arrangement. On a carrier material 1, glass, in the present case, a transparent conductive layer 2 is applied. This transparent conductive layer can be a metal layer, for example of tin, zinc, silver, titanium, iron, chromium, cobalt or even aluminum, but the layer can also comprise a metal oxide layer such as ITO (indium tin oxide) or cadmium tin oxide. The present case refers to an ITO layer. This layer 2 is applied in a known manner by vapor-coating, spraying, vaporizing or sputtering onto the carrier material.

The ITO layer used herein comprises a specific resistance of $\delta_{sch}$ of 0.007 ohms/mm. The thickness of $d_{sch}$ of the layer to be applied amounts to 350 nm. The width of $b_{sch}$ is 50 mm, and the length of $1_{sch}$ of the transparent conductive layer is 400 mm.

Therefore:

$$A_{sch} = d_{sch} \cdot b_{sch} = 0.0175 \text{ mm}^2$$

$$\frac{\delta_{sch}}{A_{sch}} = 0.4 \text{ ohms/mm}$$

$$R_{sch} = \frac{\delta_{sch}}{A_{sch}} \times 1 = 160 \text{ ohms (per transparent conductive layer)}$$

In the case of two conductive layers: $R_{schTotal}$=320 ohms.

In the case of a lightbulb of 20 watts and a resistance of 2,420 ohms at a voltage of 220 volts, the current I flowing through the conductor arrangement is calculated as follows:

$$I = \frac{U}{R_{total}}$$

$$R_{total} = R_v + R_{schTotal} = 2,420 \text{ ohms} + 320 \text{ ohms} = 2,740 \text{ ohms}.$$

Therefore:

$$I = \frac{220 \text{ V}}{2,740 \text{ ohms}} = 0.08 \text{ A}.$$

Measurements have shown that in the case of a current of I=0.08 A the conductor arrangement is heated by <2° C. However, it is possible to transfer currents of a maximum of about 1 A per conductor without heating the conductor excessively in comparison to known lighting devices.

It should be clear that, in the case of a smaller ratio of δ/A than 0.4 ohms/mm, the conductor arrangement is also heated to a smaller extent. In this manner, it is possible also to transfer substantially higher powers through the conductor arrangement of the present invention without the conductor arrangement becoming unreliable.

Figure 2:
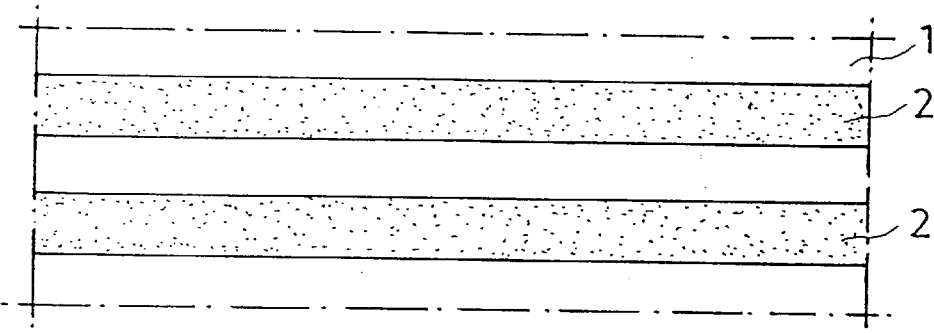
FIG. 2 shows a top plan view of the conductor arrangement of FIG. 1.

FIG. 2 shows the conductor arrangement of FIG. 1 with the carrier material 1 of glass and the transparent conductive layers 2 in a top plan view. Such a conductor arrangement can form a circuit of a consumer, a voltage source being arranged on the one end of the conductor arrangement and a consumer being arranged on the other end between the two transparent conductive layers, for example The one transparent conductive layer can be regarded as a go line, and the other one as a return line.

However, it is also possible to use both transparent conductive layers as go or return lines. It will be understood that a higher power transfer is possible in this manner.

Figure 3:
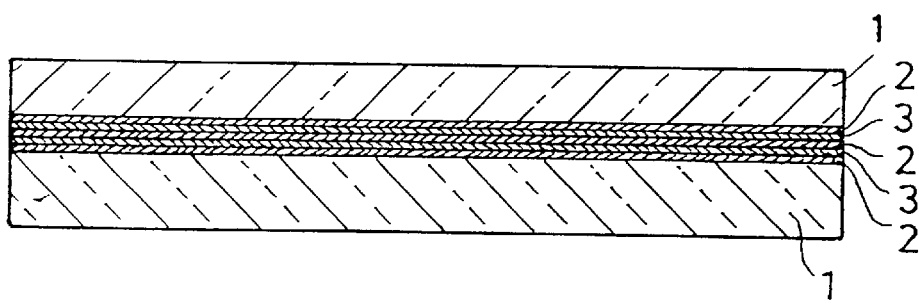
FIG. 3 shows a lateral view of a second embodiment of the conductor arrangement.

FIG. 3 shows a lateral view of an alternative embodiment of the conductor arrangement. In the case of this embodiment, a transparent conductive layer 2 is arranged on the carrier material 1, and a so-called insulation layer 3 is arranged on this layer 2. This insulation layer 3 can also be transparent and can be applied by vapor deposition. To improve the performance, multiple transparent conductive layers and insulation layers can be arranged alternately one above the other.

Figure 4:
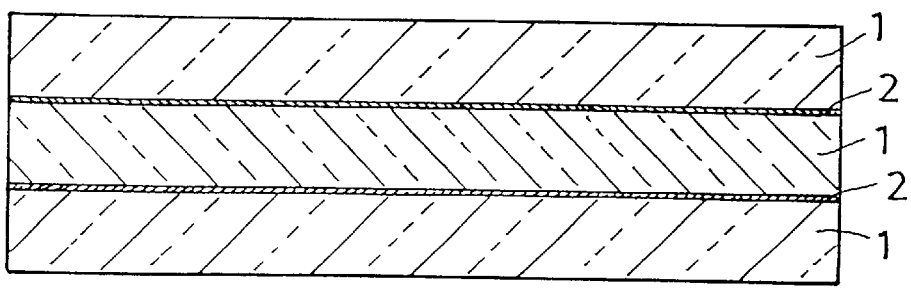
FIG. 4 shows a lateral view of a third embodiment of the conductor arrangement.

FIG. 4 shows a further embodiment of the conductor arrangement. In this case, the conductor arrangement comprises a composite arrangement, a respective transparent layer 2 being arranged between two carrier materials 1. This embodiment has the advantage of an especially high stability.

Figure 5:
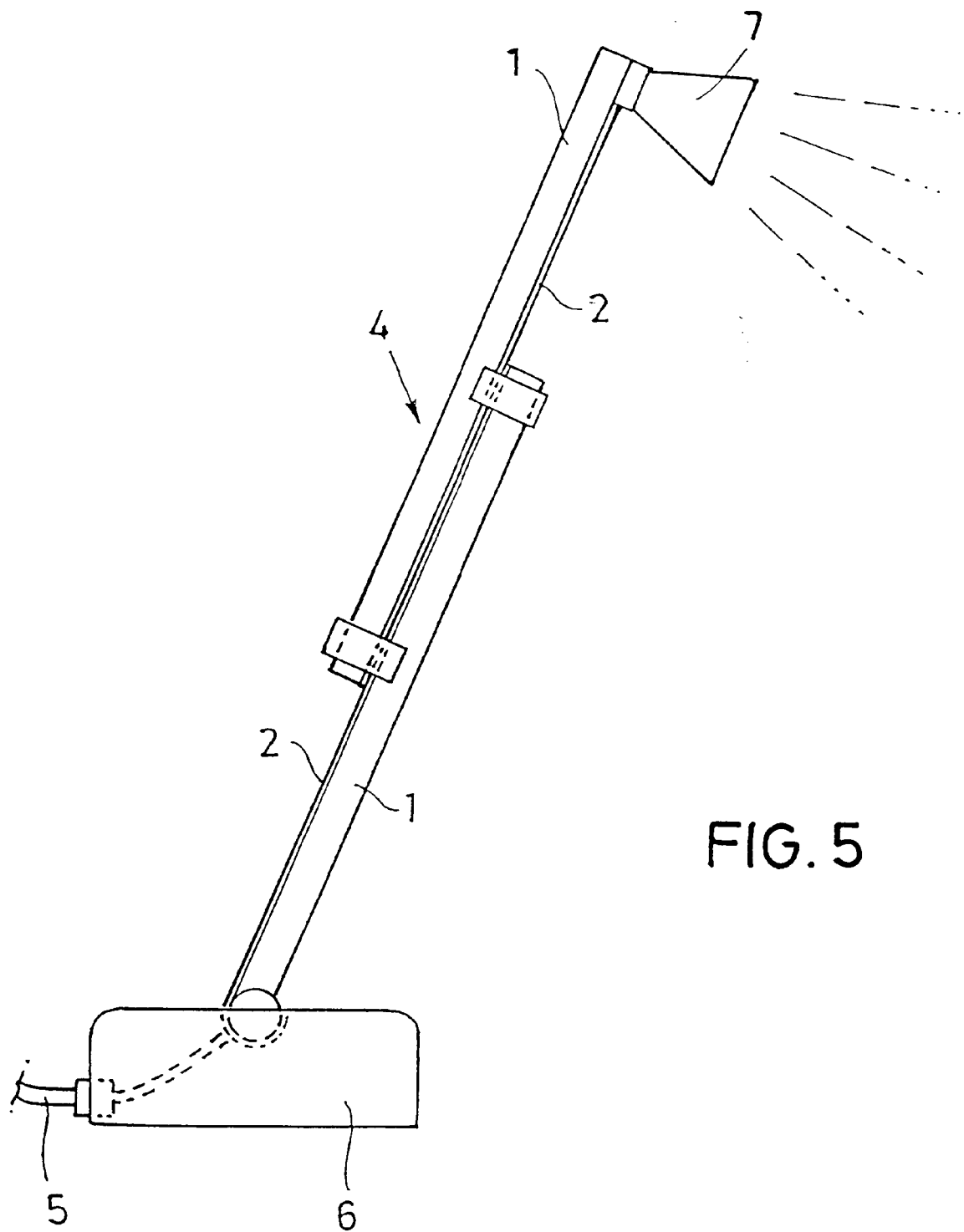
FIG. 5 shows a lateral view of a lighting device according to the invention.

FIG. 5 shows a lateral view of an electric device, in this case a lighting device 4, comprising the conductor arrangement according to the invention. The lighting device 4 is connected via a supply cable 5 to a voltage source (not represented). The supply cable 5 ends in a base element 6 whereon the conductor arrangement is arranged to be pivotable. The conductor arrangement comprises two carrier materials 1 whereon transparent conductive layers 2 are arranged, which are directed towards each other. The carrier materials 1 with the transparent conductive layers 2 are shiftable to one another, thus allowing for power control. On the end of the conductor arrangement averted from the base element 6, a consumer 7 is provided, in this case a lightbulb. This consumer can be arranged shiftably on the conductor arrangement to allow for power control.

It goes without saying that all kinds of lamps can be operated by means of the conductor arrangement described. It can be applied wherever electric cables are not supposed to be seen for aesthetic reasons, e.g. a third brake light (LED) in the rear windscreen of a vehicle or an LED lighting or display means in electric household devices.

Although a preferred embodiment of the invention has been specifically illustrated and described herein, it is to be understood that minor variations may be made in the apparatus without departing from the spirit and scope of the invention, as defined the appended claims.

What is claimed is:

1. An electric device comprising means (7) for consuming current, first means (5) for conducting current from a voltage source, second means (1, 2) for conducting current from said first current conducting means (5) to said current consuming, means (7), said second current conducting means (1, 2) including a non-conductive glass carrier material (1) and a first transparent electrically conducting layer (2), said first transparent electrically conductive layer (2) being a metal oxide sprayed upon a hot surface of said non-conductive glass carrier material (1), said first transparent electrically conductive layer (2) having a cross-sectional area $A_{sch}$ and a specific resistance $\delta_{sch}$ whose ratio $\delta_{sch}/A_{sch}$ equals substantially 0.4 ohm/mm, at least one additional transparent conductive layer (2) arranged on the non-conductive glass carrier material (1), and said transparent electrically conductive layers (2, 2) are separated from one another by a transparent insulation layer (3).

2. The electric device according to claim 1 wherein the transparent electrically conductive layer (2) has a thickness of substantially 350 nm.

3. The electric deice as defined in claim 1 wherein said ration $\delta_{sch}/A_{sch}$ is substantially 0.3 ohm/mm.

4. The electric device as defined in claim 3 wherein said current consuming means (7) is a lamp.

5. The electric device a s defined in claim 1 wherein said current consuming means (7) is a lamp.

6. The electric device as defined in claim 1 including additional second means (1, 2) for conducting current from said first conducting means (5) to said current consuming means (7), said additional second current conducting means (1, 2) including a non-conductive glass carrier material (1) and at least one transparent electrically conducting layer (2), said transparent electrically conductive layer (2) being a metal oxide sprayed upon a hot surface of said non-conductive glass carrier material (1), said transparent electrically conducting layer (2) having a cross-sectional area $A_{sch}$ and a specific resistance $\delta_{sch}$ whose ratio $\delta_{sch}/A_{sch}$ equals substantially 0.4 ohm/mm, and said transparent electrically conducting layers (2, 2) of said first and additional second current conducting means (1, 2) are in movable relationship to each other.

7. The electric device as defined in claim 6 wherein said movable relationship is a sliding connection.

8. The electric device as defined in claim 7 wherein said ratio $\delta_{sch}/A_{sch}$ is substantially 0.3 ohm/mm.

9. The electric device as defined in claim 6 wherein said first-mentioned current conducting means (1, 2) is connected to a voltage source, and said additional second current conducting means (1, 2) is connected to said current consuming means (7).

10. The electric device as defined in claim 9 wherein said ratio $\delta_{sch}/A_{sch}$ is substantially 0.3 ohm/mm.

11. The electric device as defined in claim 6 wherein said ratio $\delta_{sch}/A_{sch}$ is substantially 0.3 ohm/mm.

12. An electric device comprising means (7) for consuming current, first means (5) for conducting current from a voltage source, second means (1, 2) for conducting current from said first current conducting means (5) to said current consuming means (7), said second current conducting means (1, 2) including a first non-conductive glass carrier material (1) and a first transparent electrically conducting layer (2), said first transparent electrically conductive layer (2) being a metal oxide sprayed upon a hot surface of said non-conductive glass carrier material (1), said first transparent electrically conductive layer (2) having a cross-sectional area $A_{sch}$ and a specific resistance $\delta_{sch}$ whose ratio $\delta_{sch}/A_{sch}$ equals substantially 0.4 ohm/mm, and at least one additional non-conductive glass carrier material (1) and another transparent conductive layer (2) arranged on top of one another.

13. The electric device according to claim 12 wherein the non-conducting glass carrier materials (1) are in sliding relationship to each other.

14. The device according to claim 12 wherein the transparent electrically conductive layers (2) are arranged in contact with each other.

15. The electric device as defined in claim 12 wherein said ratio $\delta_{sch}/A_{sch}$ is substantially 0.3 ohm/mm.

16. The electric device as defined in claim 15 wherein said current consuming means (7) is a lamp.

17. The electric device as defined in claim 15 wherein said current consuming means (7) is a lamp.

18. The electric device according to claim 12 wherein the transparent electrically conductive layer (2) has a thickness of substantially 350 nm.

19. An electric device comprising means (7) for consuming current, first means (5) for conducting current from a voltage source, second means (1, 2) for conducting current from said first current conducting means (5) to said current consuming means (7), said second current conducting means (1, 2) including a non-conductive glass carrier material (1) and at least one transparent electrically conducting layer (2), said transparent electrically conductive layer (2) being a metal oxide sprayed upon a hot surface of said non-conductive glass carrier material (1), said transparent electrically conducting layer (2) having a cross-sectional area $A_{sch}$ and a specific resistance $\delta_{sch}$ whose ratio $\delta_{sch}/A_{sch}$ equals substantially 0.4 ohm/mm, and the current consuming means (7) is slidable relative to said second current conducting means (1, 2).

20. The electric device as defined in claim 19 wherein said ratio $\delta_{sch}/A_{sch}$ is substantially 0.3 ohm/mm.

21. The electric device as defined in claim 20 wherein said current consuming means (7) is a lamp.

22. The electrical device as defined in claim 19 wherein said current consuming means (7) is a lamp.

23. The electric device according to claim 19 wherein the transparent electrically conductive layer (2) has a thickness of substantially 350 nm.

* * * * *